United States Patent
Fujieda et al.

(10) Patent No.: US 9,307,682 B2
(45) Date of Patent: Apr. 5, 2016

(54) APPARATUS AND METHOD FOR DISSIPATING HEAT

(71) Applicant: SONY CORPORATION, Minato-ku (JP)

(72) Inventors: Tadaomi Fujieda, Tokyo (JP); Tatsuhito Aono, Tokyo (JP)

(73) Assignee: Sony Corporation, Tokyo (JP)

( * ) Notice: Subject to any disclaimer, the term of this patent is extended or adjusted under 35 U.S.C. 154(b) by 305 days.

(21) Appl. No.: 13/873,862

(22) Filed: Apr. 30, 2013

(65) Prior Publication Data

US 2014/0321058 A1    Oct. 30, 2014

(51) Int. Cl.
*H05K 7/20*    (2006.01)
*G06F 1/20*    (2006.01)

(52) U.S. Cl.
CPC .............. *H05K 7/2099* (2013.01); *G06F 1/203* (2013.01); *H05K 7/20336* (2013.01); *Y10T 29/49353* (2015.01)

(58) Field of Classification Search
CPC ......... G06F 1/20; G06F 1/203; H01L 23/427; H05K 7/2099
USPC ....................... 361/679.46–679.54, 688–723; 165/80.4–80.5, 104.33; 257/715, 257/E23.088; 174/15.2
See application file for complete search history.

(56) References Cited

U.S. PATENT DOCUMENTS

| | | | | |
|---|---|---|---|---|
| 5,506,032 A | * | 4/1996 | Rowe | 428/178 |
| 7,336,494 B2 | * | 2/2008 | Nishimura et al. | 361/714 |
| 7,561,426 B2 | * | 7/2009 | Jeong | 361/704 |
| 8,871,381 B2 | * | 10/2014 | Park | H01M 2/0404 429/185 |
| 2009/0080161 A1 | * | 3/2009 | Peng et al. | 361/719 |
| 2010/0266885 A1 | * | 10/2010 | Lee | 429/120 |
| 2011/0051369 A1 | * | 3/2011 | Takahara | 361/696 |
| 2012/0044641 A1 | * | 2/2012 | Zhu et al. | 361/692 |
| 2014/0251577 A1 | * | 9/2014 | Connors | 165/67 |

* cited by examiner

*Primary Examiner* — Zachary M Pape
(74) *Attorney, Agent, or Firm* — Oblon, McClelland, Maier & Neustadt, L.L.P.

(57) ABSTRACT

An apparatus includes a display. The display may include a frame disposed at a bottom surface of the display. The apparatus may include a semiconductor chip. A heat pipe constructed of a thermally conductive material may be affixed to the frame. A surface of the heat pipe may oppose the semiconductor chip at a predetermined distance from the semiconductor chip.

11 Claims, 9 Drawing Sheets

FIG. 15

APPARATUS AND METHOD FOR DISSIPATING HEAT

BACKGROUND

1. Technical Field

The present disclosure relates to a method and apparatus for dissipating heat. In particular, the present disclosure relates to a method and apparatus for dissipating heat generated by components in a mobile device.

2. Description of Related Art

Mobile devices include semiconductor chips that utilize integrated circuits for executing various functional aspects of mobile device operation. The semiconductor chips included with many mobile devices typically emit heat that should be dissipated throughout the mobile device so that damage to the semiconductor chips does not occur. To address this problem, some mobile devices may include mechanisms that thermally radiate heat from the mobile device. For example, a mobile device may contain a graphite sheet with sufficient heat conductivity to diffuse heat generated by a semiconductor chip. The graphite sheet may be arranged in a comparatively large area so that heat may be diffused from the semiconductor chip efficiently.

SUMMARY

Performance increases in recent semiconductor chips typically have resulted in a corresponding increase in the amount of heat emitted from the semiconductor chip during operation. Therefore, thermal diffusion properties exhibited by some heat diffusing mechanisms, such as graphite sheets, may not be sufficient to accommodate the thermal radiation emitted from these enhanced semiconductor chips.

Among other things, the present disclosure describes an apparatus that includes a display. The display may include a frame disposed at a bottom surface of the display. The apparatus may include a semiconductor chip. A heat pipe constructed of a thermally conductive material may be affixed to the frame. A surface of the heat pipe may oppose the semiconductor chip at a predetermined distance from the semiconductor chip.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Referring now to the drawings, wherein like reference numerals designate identical or corresponding parts throughout the several views.

Figure 1:
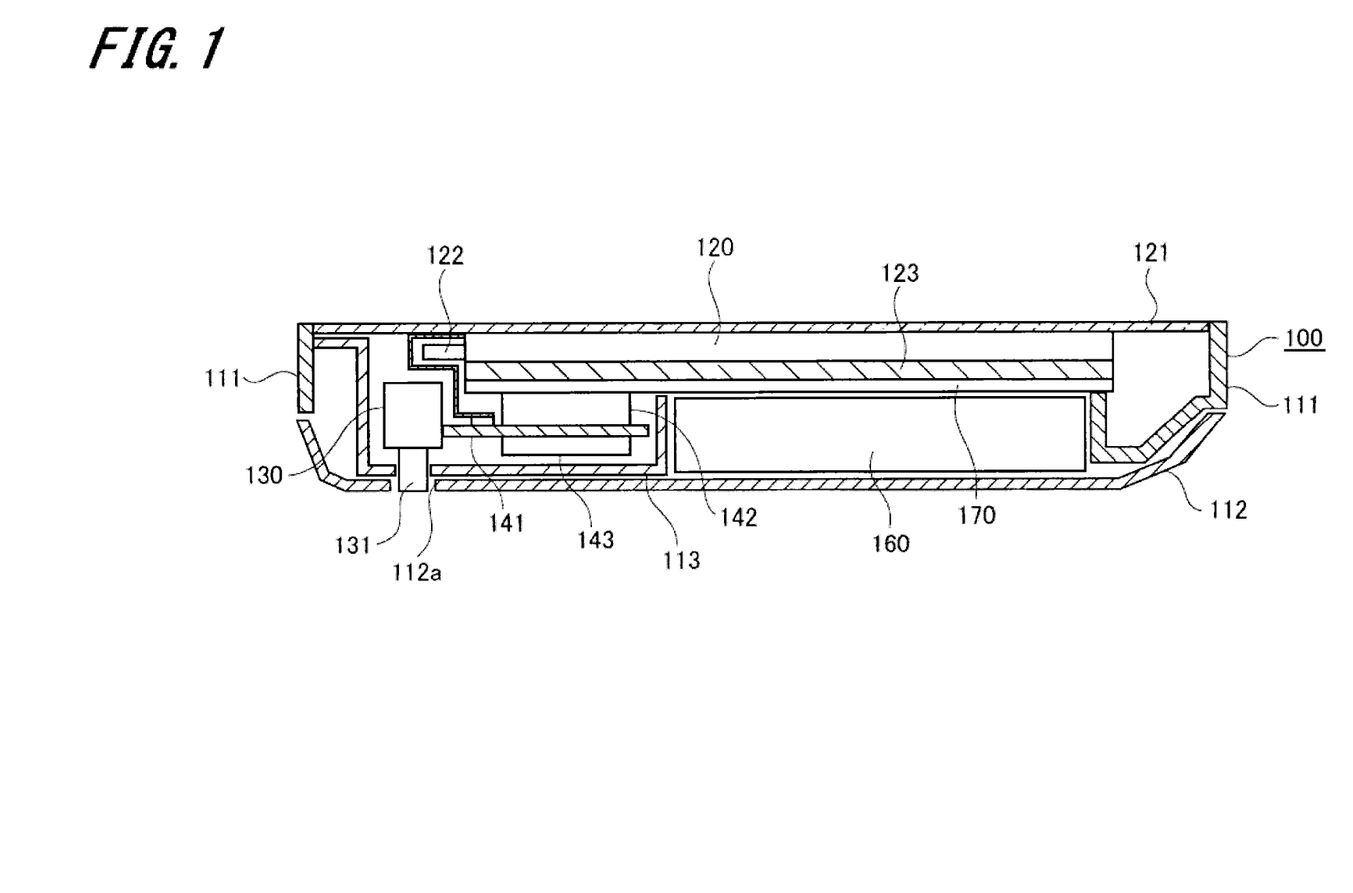
FIG. 1 illustrates an exemplary mobile device.

FIG. 1 illustrates an exemplary mobile device 100. The mobile device 100 may, for example, be a smartphone, a tablet device, or the like. A protective cover 111 may surround an outer portion of the mobile device 100. The cover 111 may be comprised of a synthetic resin and/or a metallic material.

The mobile device 100 may include a display 120. The display 120 may be a Liquid Crystal Display (LCD), a Light Emitting Diode (LED) display, or a similar display technology typically used in mobile devices. Dimensions of the display 120 may be of sufficiently small size such that a user may easily carry the mobile device 100. For example, the display 120 may have a diagonal length of approximately 4 to 6 inches. A window 121 may be disposed on a top surface of the display 120. The window 121 may provide a protective covering for the display 120 such that a user may perform touch operations for the mobile device 100 by contacting the display 120 with an instruction object, such as a finger or stylus. The window 121 may be formed integrally with the cover 111. The window 121 may be comprised of a glass and/or a synthetic resin sheet. A backlight 122 may be included in the mobile device 100 for providing lighting to the display 120. The backlight 122 may, for example, be comprised of one or more light emitting diodes.

A frame 123 may be disposed at a back surface of the display 120. The frame 123 may be formed of a thermally conductive material, such as stainless steel and/or aluminum, and may cover substantially the entire back surface of the display 120.

A circuit board 141 may be arranged behind a bottom surface of the display 120. The circuit board 141 may include one or more semiconductor chips arranged on a top and/or a bottom surface of the circuit board 141. Shields 142 and 143 may be respectively arranged at a top and a bottom surface of the circuit board 141. The shields 142 and 143 may be arranged over one or more semiconductor chips included on the circuit board 141. The shields 142 and 143 may be formed of a thermally conductive material such that heat may be diffused from the semiconductor chips. For example, the shields 142 and 143 may be metallic. A camera 130 that includes a lens 131 projecting through a hole 112a may be attached to the circuit board 141 for capturing images.

A battery 160 may be disposed within the mobile device 100. The battery 160 may include circuitry for receiving and/or generating an alternating and/or direct current for powering the various elements of the mobile device 100. For example, the battery 160 may include circuitry for receiving an alternating current for charging the battery 160, and may include a rectifier for generating a direct current for powering the elements of the mobile device 100. As a non-limiting example, the battery 160 may be a lithium-ion type battery.

A battery cover 112 may cover substantially an entire back portion of the mobile device 100, including a location corresponding to the placement of the battery 160 within the mobile device 100. Additionally, a rear cover 113 may be disposed within the mobile device 100 for housing various elements included in the mobile device 100. The battery cover 112 and the rear cover 113 may be comprised of a synthetic resin and/or a metallic material. Moreover, the battery cover 112 may be attached to the cover 111, or alternatively formed integrally with the cover 111.

The mobile device 100 may include a heat pipe 170 for dissipating heat emitted from within the mobile device 100. The non-limiting example of FIG. 1 illustrates the heat pipe 170 arranged adjacent to the frame 123; however, this arrangement is not limiting. Additionally, while the example of FIG. 1 illustrates a single heat pipe 170 included within the mobile device 100, it should be appreciated that a plurality of heat pipes may be arranged within the mobile device 100 for dissipating heat emitted from the various elements within the mobile device 100. Moreover, the heat pipe 170 may be of a flat shape, or be of another shape (e.g., a rounded shape).

The heat pipe 170 may be comprised of a thermally conductive material such that heat is transferred from a high temperature side to a low temperature side. A liquid may be enclosed within the heat pipe 170 such that heat is transferred via evaporation and aggregation of the condensed liquid. That is, the liquid enclosed within the heat pipe 170 may undergo a phase transition to steam due to heat emitted at the high temperature side of the heat pipe 170. The steam generated from the heated liquid may move to the low temperature side of the heat pipe 170, where it aggregates and returns to liquid form. The aggregated liquid may be absorbed by, for example, a wick within the inner wall of the heat pipe 170, and be transmitted via the wick to the high temperature side of the heat pipe 170.

As shown in FIG. 1, one side of the heat pipe 170 may be arranged such that it contacts the shield 142 on the circuit board 141. However, those of ordinary skill will appreciate that the heat pipe 170 may be arranged within the mobile device 100 such that heat generated by any element is dissipated throughout the mobile device 100. Specifically, the heat pipe 170 may be arranged at a predetermined distance from an element of the mobile device 100, the predetermined distance being based on a thermal radiation radius corresponding to the mobile device 100 element. The thermal radiation radius may correspond to a distance at which heat is radiated from an element. Those of ordinary skill will also appreciate that heat transfer and/or heat dissipation may be inversely proportional to the thermal radiation radius length.

Figure 2:
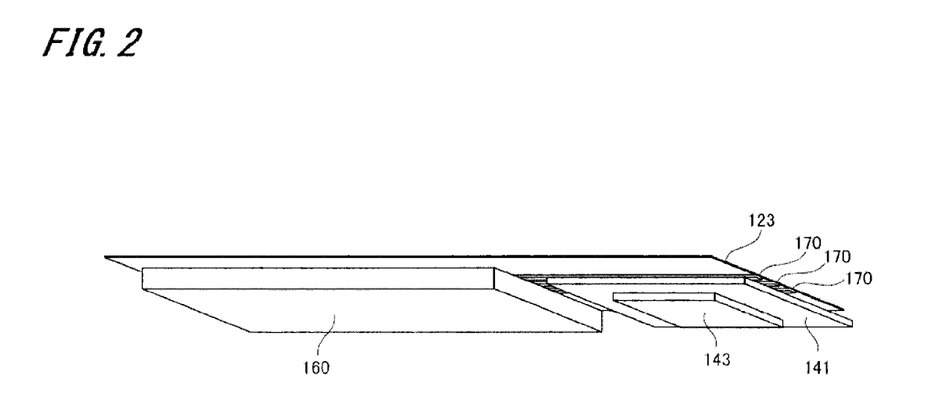
FIG. 2 illustrates an exemplary arrangement of elements within a mobile device.
Figure 3:
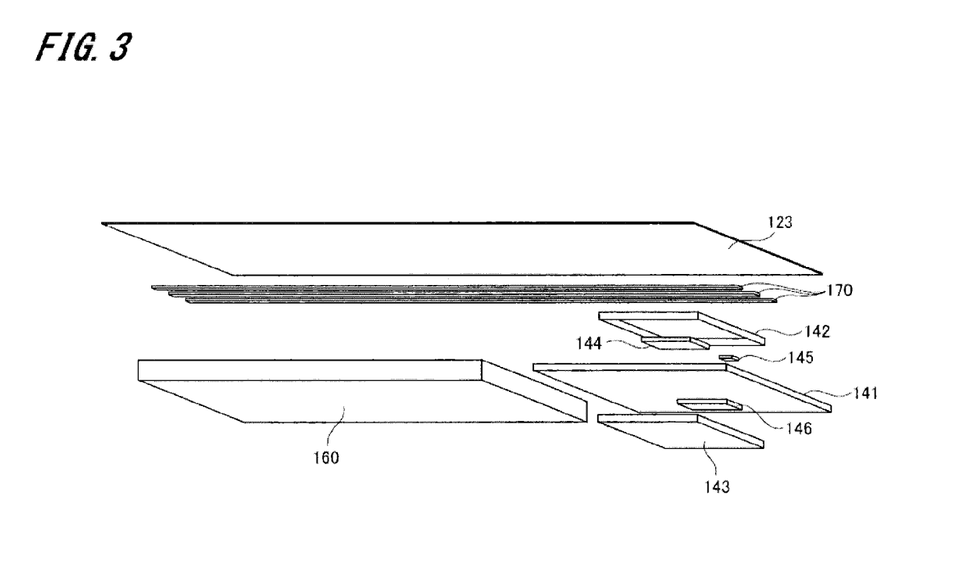
FIG. 3 illustrates an exploded view corresponding to the exemplary arrangement of FIG. 2.

Next, FIG. 2 illustrates an exemplary arrangement of the heat pipe 170 within the mobile device 100, and FIG. 3 illustrates an exploded view corresponding to the exemplary arrangement of FIG. 2. As seen in FIG. 3, multiple heat pipes 170 may be disposed at fixed intervals along a bottom surface of the frame 123. While the examples of FIGS. 2 and 3 illustrate three heat pipes for the heat pipe 170, it should be appreciated that any number of heat pipes may be used, depending on the size and/or thermal characteristics of the frame 123 and the desired performance characteristics and heat transfer requirements of the mobile device 100 semiconductor chips. Moreover, while the heat pipes 170 shown in FIGS. 2 and 3 are substantially the same length as the frame 123 and linearly arranged in a longitudinal direction corresponding to a side of the frame 123, these dimensional characteristics of the heat pipes are not limiting and other shapes and/or dimensions of heat pipes may be implemented within the scope of the present disclosure.

Referring now to FIG. 3, the circuit board 141 may include semiconductor chips 144, 145, and 146, which are mounted on both the top and the bottom surfaces of the circuit board 141. The shields 142 and 143 may accordingly be arranged on the top and bottom surfaces of the circuit board 141 such that the semiconductor chips are covered by the shields 142 and 143. For example, the shield 142 may be arranged on a top surface of the circuit board 141 such that the shield 142 covers the semiconductor chips 144 and 145. Similarly, the shield 143 may be arranged on a bottom surface of the circuit board 141 such that the semiconductor chip 146 is covered. During operation of the mobile device 100, heat is emitted by the semiconductor chips 144-146, which causes the temperature to increase in the areas surrounding the semiconductor chips. Heat may be transferred via the thermally conductive materials comprising the shields 142 and 143. Similarly, heat may be transferred from the shields 142 and 143 to the heat pipes 170 such that heat is dissipated from the semiconductor chips. For example, FIG. 3 illustrates a side of the heat pipes 170 contacting a surface of the shield 142, thereby providing a heat transfer medium to dissipate heat from the semiconductor chips 144 and 145. Lastly, FIGS. 2 and 3 illustrate the battery 160 disposed at a location below the heat pipe 170 that does not include the circuit board 141. As will be described later in further detail, certain aspects of the present disclosure may include heat pipe arrangements corresponding to aspects of the mobile device battery.

Figure 4:
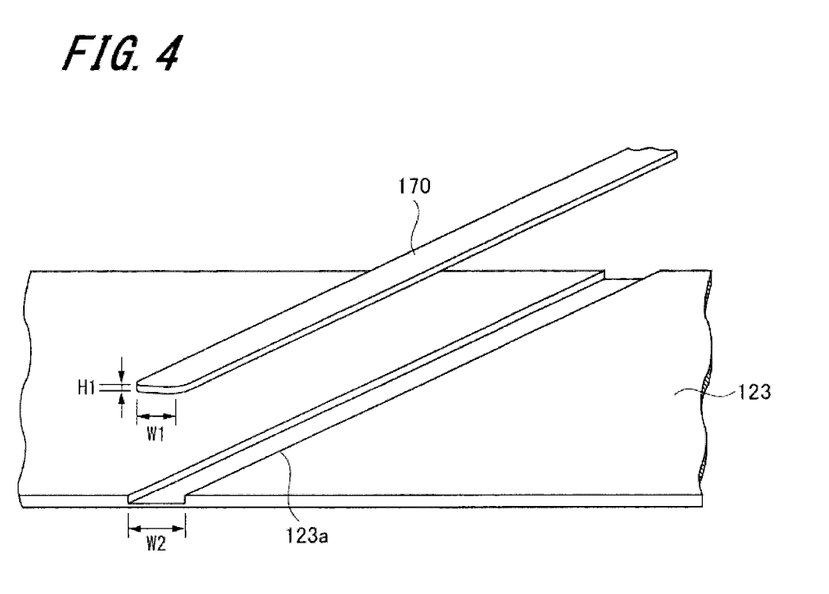
FIG. 4 illustrates exemplary aspects of a heat pipe provided on a mobile device display frame.
Figure 5:
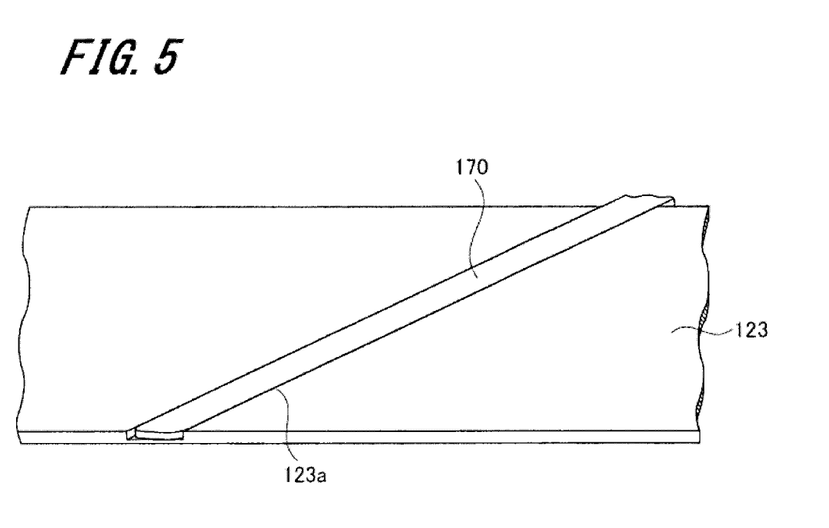
FIG. 5 illustrates an exemplary heat pipe provided in a recessed portion.

Next, FIGS. 4 and 5 illustrate a non-limiting example of an arrangement of the heat pipe 170 on the frame 123. Specifically, FIG. 4 illustrates exemplary aspects of a recessed portion of the frame 123 in which the heat pipe 170 may be arranged, and FIG. 5 illustrates a state in which the heat pipe 170 has been disposed within the recessed portion illustrated in FIG. 4.

Referring to FIG. 4, the heat pipe 170 illustrated in this example has a flat shape with a width W1 and a height H1. The width and height of the heat pipe 170 may be determined based on the desired heat transfer characteristics of the heat pipe 170. As a non-limiting example, the heat pipe 170 may have a lateral width of approximately 5 millimeters and a height of approximately 0.6 millimeters. However, the present disclosure may easily be adapted such that the heat pipe 170 has other dimensional characteristics and/or is shaped differently than the examples shown in FIGS. 4 and 5. For example, the heat pipe 170 may have a rounded shape.

A recess 123a is illustrated on a surface of the frame 123. The recess 123a may have a lateral width W2, which may be greater than or equal to the width W1 of the heat pipe 170. Further, the recess 123a has a depth with which to accommodate the height of the heat pipe 170. That is, the heat pipe 170 may be fitted in the recess 123a such that a top surface of the heat pipe 170 is substantially flush with a top surface of the frame 123, as shown in FIG. 5. Alternatively, the top surface of the heat pipe 170 may be slightly raised or lowered relative to the top surface of the frame 123. Additionally, when the heat pipe 170 has been placed in the recess 123a of the frame 123, the heat pipe 170 may be fixed to the surface of the frame 123 with, for example, an adhesive agent.

While the inclusion of the recess 123a for embedding the heat pipe 170 in the frame 123 provides the benefit of limiting the overall thickness of the mobile device 100, providing a recessed portion in the frame 123 is not required, and the heat pipe 170 may be affixed to the top surface of the frame 123 at an area that is not recessed. Further, the present disclosure may be easily adapted such that other arrangements of recesses and/or heat pipes are utilized. For example, the recess 123a may be configured at a different angle, arranged on a different surface, and/or possess different dimensions than those illustrated and described with respect to FIGS. 4 and 5. Additionally, alternative shapes and quantities of heat pipes may be utilized. For example, a plurality of recessed heat pipes 170 may include a curvature.

Figure 6:
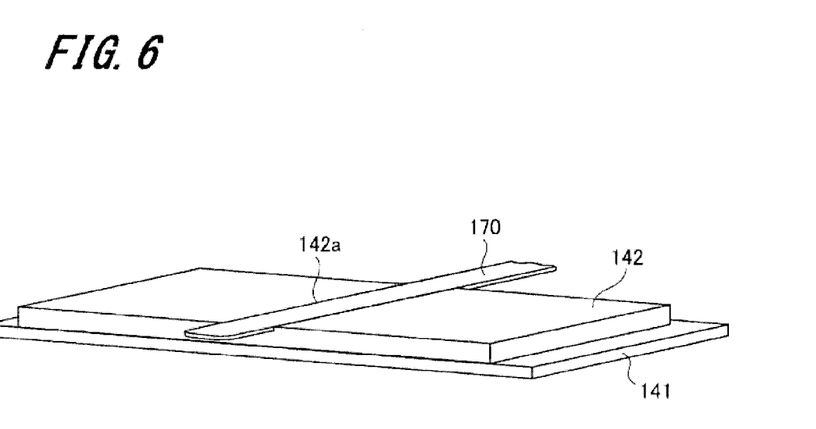
FIG. 6 illustrates an exemplary arrangement of providing a heat pipe contacting a semiconductor chip shield.

The present disclosure is not limited to providing recessed areas only within a display frame, such as frame 123. In another aspect of the present disclosure, a recessed area may be provided in a shield covering a semiconductor chip arranged on a circuit board. As a non-limiting example, FIG. 6 illustrates the heat pipe 170 arranged within a recess 142a provided in the shield 142. As discussed previously, shields such as the shield 142 may be arranged on the circuit board 141 in an area corresponding to a semiconductor chip such that heat emitted from the semiconductor chips during operation is dissipated via the shield 142 and the heat pipe 170. The lateral width and depth of the recess 142a shown in FIG. 6 may be similar to the width and depth illustrated in FIG. 4. Similar to the case in which a recess is provided in a display frame, such as the example shown in FIG. 4, providing the recess 142a in the shield 142 such that the heat pipe 170 is embedded within the shield 142 allows for limiting the overall thickness of a corresponding mobile device in which the elements shown in FIG. 6 are arranged. Further reductions in overall mobile device size may also be achieved by combining aspects of embedding the heat pipe 170 within elements of the mobile device 100. For example, aspects of FIGS. 4 and 6 may be combined in a singular mobile device for the purpose of reducing the overall thickness of the device.

Figure 7:
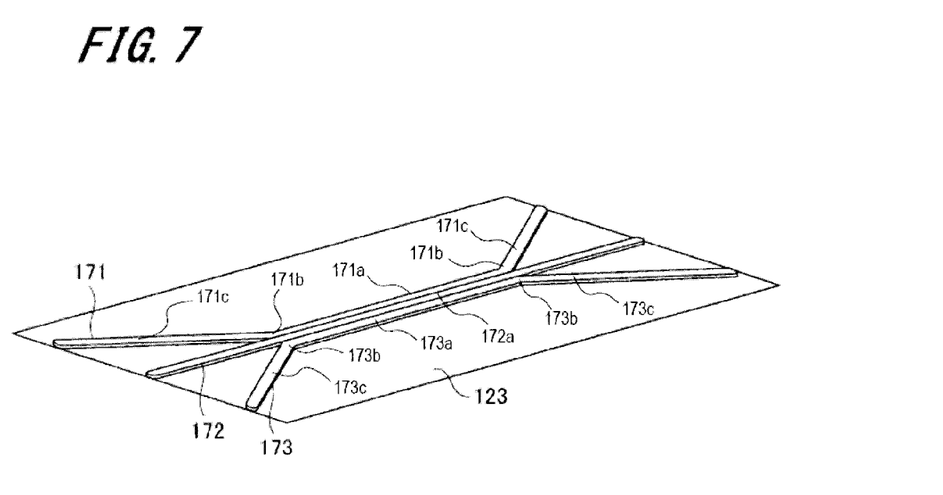
FIG. 7 illustrates exemplary aspects of heat pipe shapes.

Next, FIG. 7 illustrates a non-limiting example of an alternative arrangement of heat pipes on a display frame. Referring to FIG. 7, heat pipes 171, 172, and 173 are arranged on a top surface of the frame 123. The heat pipes 171-173 may be of a similar material composition to that of the heat pipe 170. Additionally, the heat pipe 172 shown in FIG. 7 is illustrated as having similar dimensional and shape characteristics as those of the heat pipe 170. A center portion 171a corresponding to heat pipe 171 and a center portion 173a corresponding to the heat pipe 173 may be arranged on the frame 123 at narrow intervals on opposing sides of the heat pipe 172. The heat pipe 172 may be arranged at a substantially centerline region of the frame 123. The heat pipe 173 may include an extension portion 173c extending from a bend 173b located on each end of the center portion 173a. Similarly, the heat pipe 171 may include an extension portion 171c extending from a bend 171b located on each end of the center portion 171a. The extension portions 171c and 173c may extend to a widthwise and/or a lengthwise edge of the frame 123. By including a curvature in the heat pipes 171 and 173 as shown in the example of FIG. 7, heat may be efficiently dissipated throughout the frame 123 to which the heat pipes are in contact.

Figure 8:
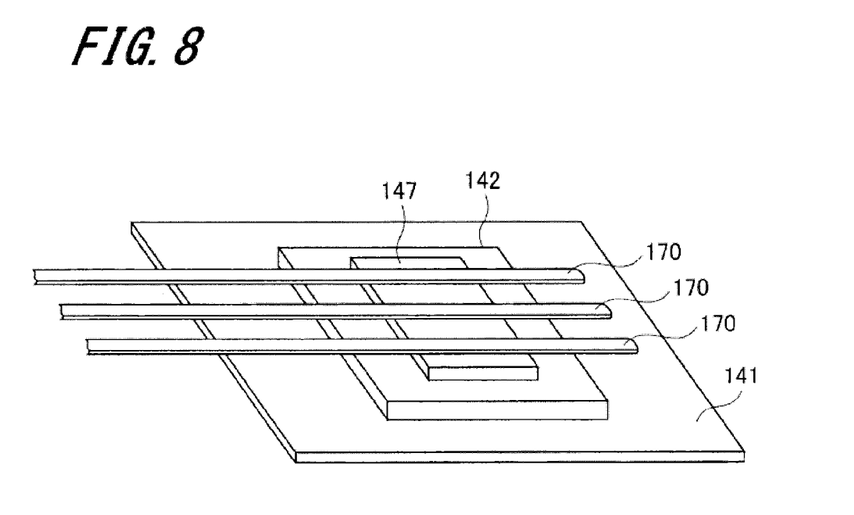
FIG. 8 illustrates an exemplary heat pipe arrangement including a conductive film.

Next, FIG. 8 illustrates a non-limiting example in which a conductive sheet 147 is interposed between the heat pipes 170 and the shield 142, which is arranged on the circuit board 141. The conductive sheet 147 may be a thin film material having high thermal conductivity characteristics. The conductive sheet 147 may be disposed on a surface of the shield 142, and the heat pipes 170 may be disposed on the conductive sheet 147. Arranging the conductive sheet 147 between the shield 142 and the heat pipes 170 provides for efficient heat transfer between the shield 142 and the heat pipes 170. As an alternative to a thin film material, such as the conductive sheet 147 shown in FIG. 8, similar heat transfer efficiencies may be achieved by utilizing paste-form thermally conductive materials, such as grease, in lieu of the conductive sheet 147.

Figure 9:
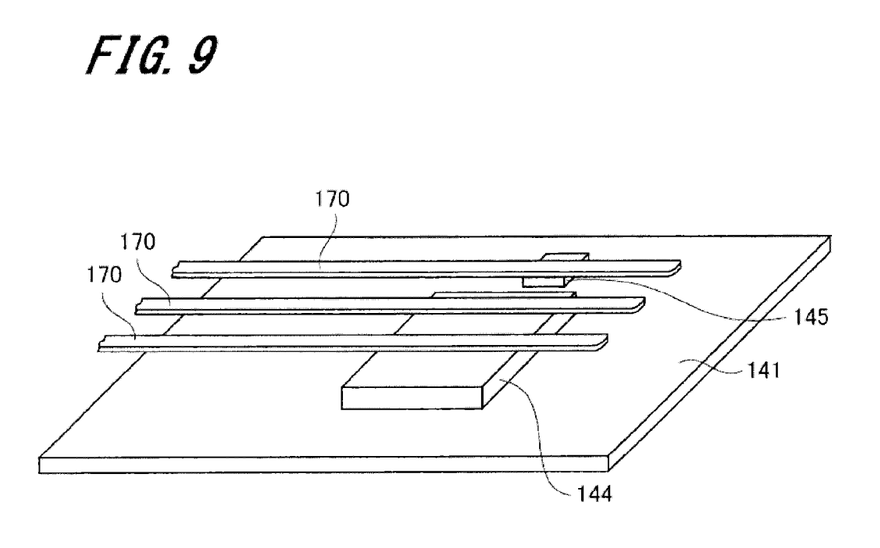
FIG. 9 illustrates an exemplary arrangement of heat pipes contacting semiconductor chips.

Next, FIG. 9 illustrates a non-limiting example in which the heat pipes 170 are placed in direct contact with semiconductor chips 144 and 145. In the foregoing examples, a shield material, such as the shield 142, has been described as being arranged over the semiconductor chips placed on the circuit board 141 surface. In the exemplary arrangement of FIG. 9, the heat pipes 170 are directly contacting a surface of the semiconductor chips 144 and 145. Further, the exemplary arrangement shown in FIG. 9 may additionally include thermally conductive materials, such as a conductive sheet, interposed between the heat pipes 170 and the semiconductor chips 144 and 145.

Figure 10:
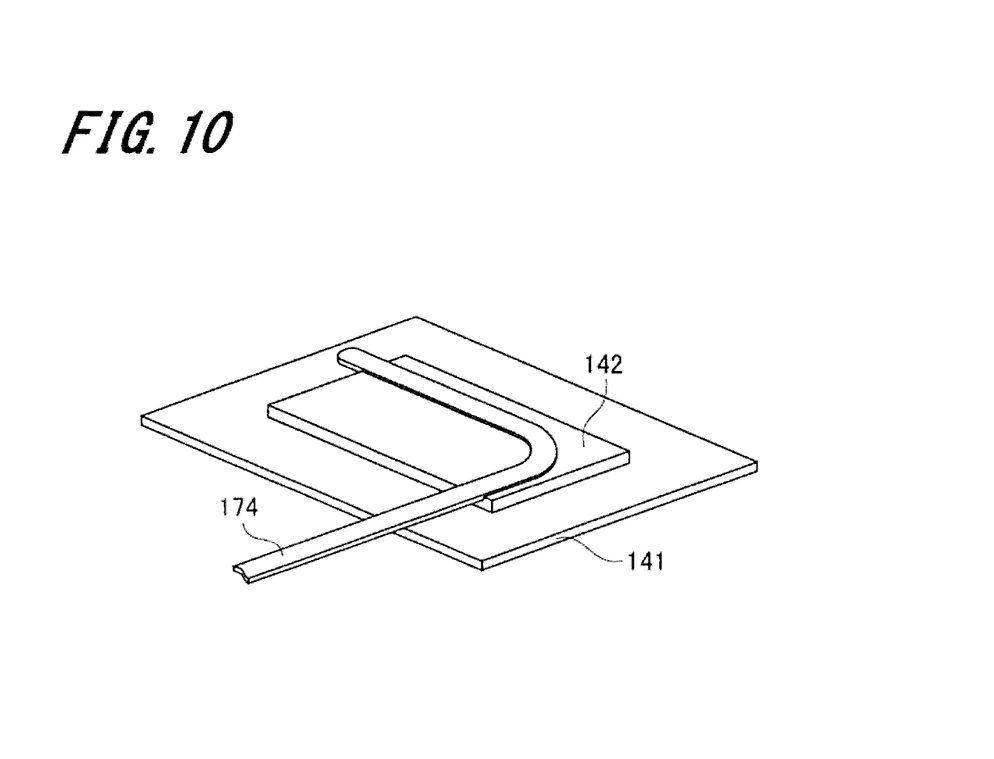
FIG. 10 illustrates an exemplary aspect of a heat pipe shape.

Next, FIG. 10 illustrates a non-limiting example of a heat pipe shape according to another aspect of the present disclosure. The example of FIG. 10 illustrates a heat pipe 174 arranged along a surface of the shield 142. The heat pipe 174 runs linearly along a longitudinal direction of the shield 142 and bends at approximately a 90° angle. The non-linear shape of the heat pipe 174 may provide for an increased heat transfer surface area relative to the case in which a linear heat pipe is used. Consequently, a heat pipe having a non-linear shape (e.g., heat pipe 142) arranged across a surface of the shield 142 may improve heat transfer efficiency between the shield 142 and the non-linear heat pipe, thereby increasing heat dissipation efficiency in the mobile device 100.

Figure 11:
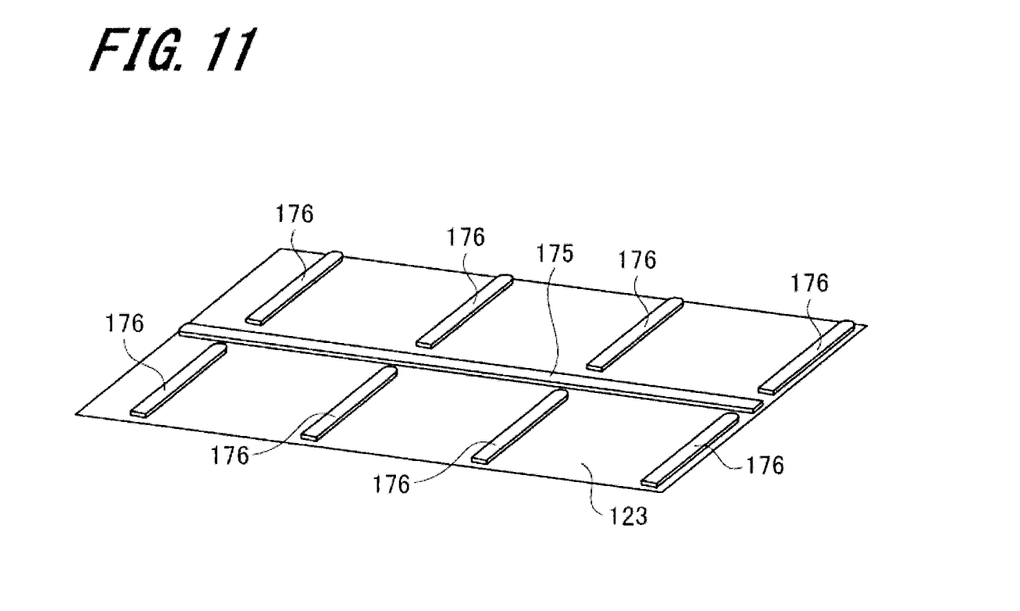
FIG. 11 illustrates an exemplary heat pipe arrangement.

Next, FIG. 11 illustrates a non-limiting example in which a heat pipe 175 is arranged in a longitudinal direction at a substantially centerline region of the display frame 123. As shown in FIG. 11, a plurality of heat pipes 176 may be arranged at a fixed interval on opposing sides of the heat pipe 175. Each of the heat pipes 176 may have a length that is approximately half the width of the display frame 123. Arranging the heat pipe 175 at a substantially centered region in combination with the heat pipes 176 at predetermined intervals along the frame 123 surface provides improved heat transfer efficiency.

Figure 12:
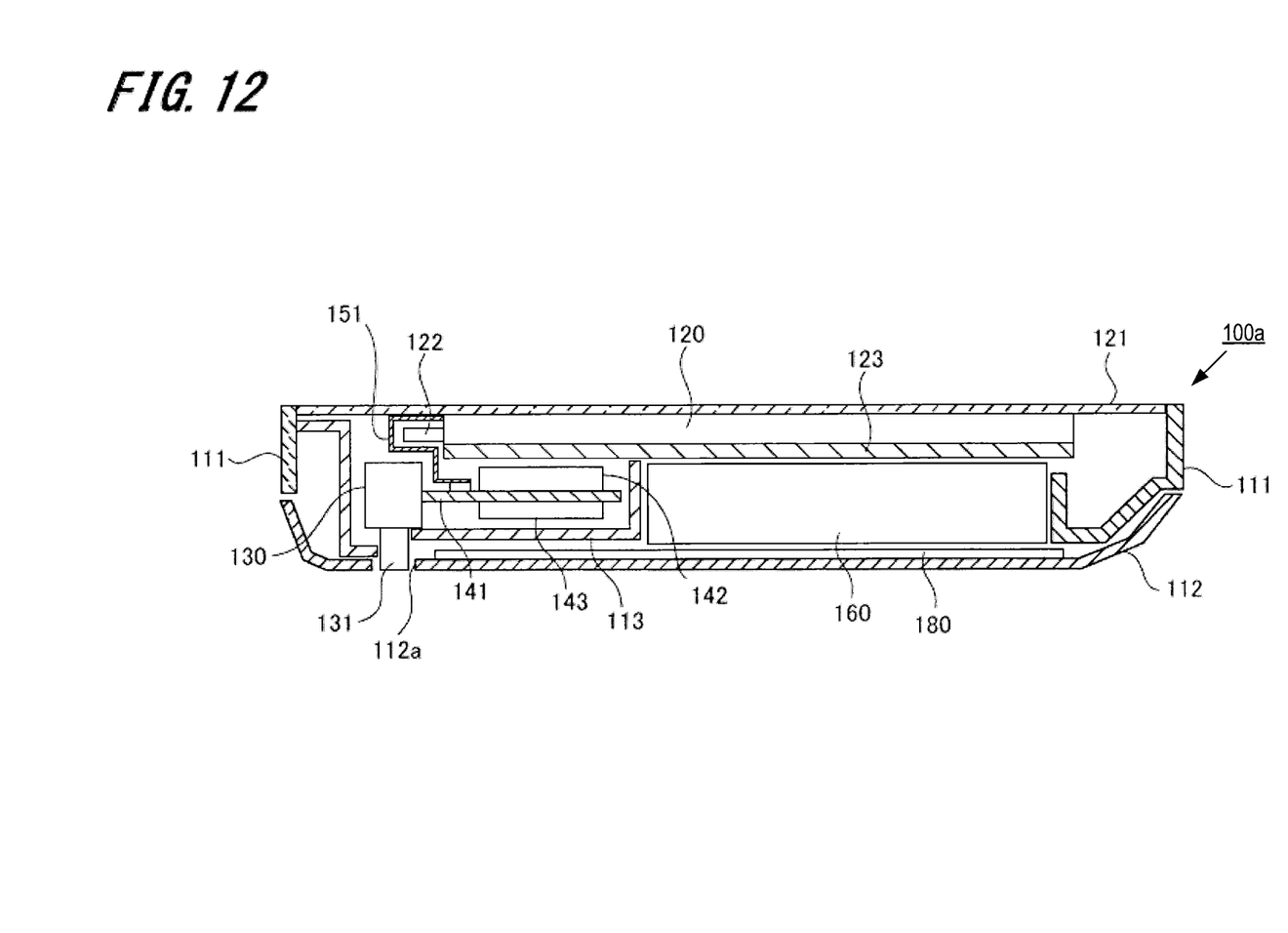
FIG. 12 illustrates an exemplary heat pipe arrangement according to another aspect of the present disclosure.

While the foregoing examples illustrated cases in which a heat pipe was formed on a frame and/or shield surface, aspects of the present disclosure may easily be adapted by those of ordinary skill in the art to provide heat pipes on other mobile device elements. As a non-limiting example, FIG. 12 illustrates an exemplary arrangement in which a heat pipe 180 is arranged on the battery cover 112. The battery cover 112 may have dimensions of sufficient size such that it substantially covers the entire back of a mobile device 100a. The heat pipe 180 may be arranged on the battery cover 112 such that it adjoins a region including the circuit board 141 with a location where the battery 160 is installed. Additionally, although the shield 143 on the lower surface of the circuit board 141 is shown to be separated from the heat pipe 180 in FIG. 12, the exemplary arrangement of FIG. 12 may be easily adapted such that the shield 143 contacts the heat pipe 180. In addition, it is preferable that the battery cover 112 to which the heat pipe 180 is attached be comprised of a sufficiently thermally conductive material, such as a metal. Alternatively, a thermally conductive material such as a metal plate may be affixed to an inner surface of the battery cover 112 to improve thermal radiation efficiency. Moreover, recessed portions similar to recess 123a shown in FIG. 4 may be provided in the battery cover 112 to ensure the thickness of the mobile device 100a does not increase unnecessarily.

Figure 13:
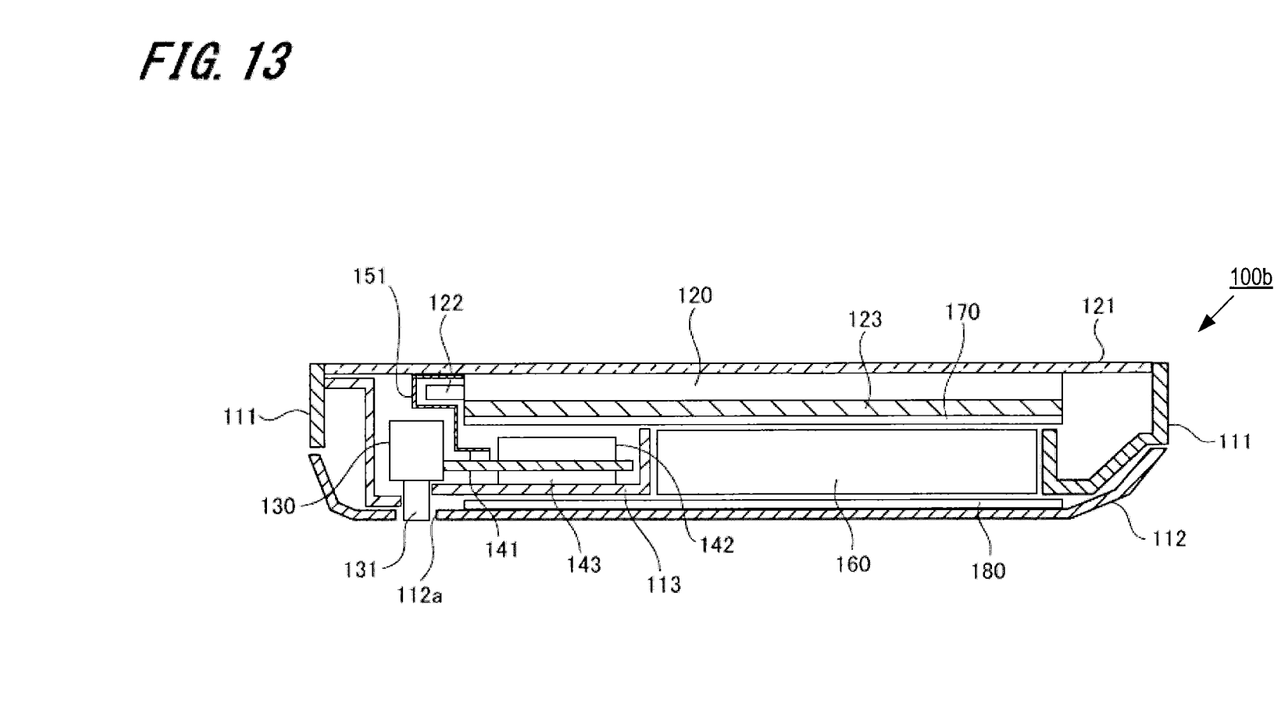
FIG. 13 illustrates a non-limiting example of providing multiple heat pipes in a mobile device.

Next, FIG. 13 illustrates a non-limiting example of a mobile device 100b in which both the heat pipe 170 adjacent to the frame 123 and the heat pipe 180 on the battery cover 112 are included. By placing the heat pipes 170 and 180 as shown in the example of FIG. 13, heat dissipation by thermal radiation on multiple surfaces of the mobile device 100b may be obtained, thereby improving the overall efficiency of heat dissipation of the mobile device 100b.

Figure 14:
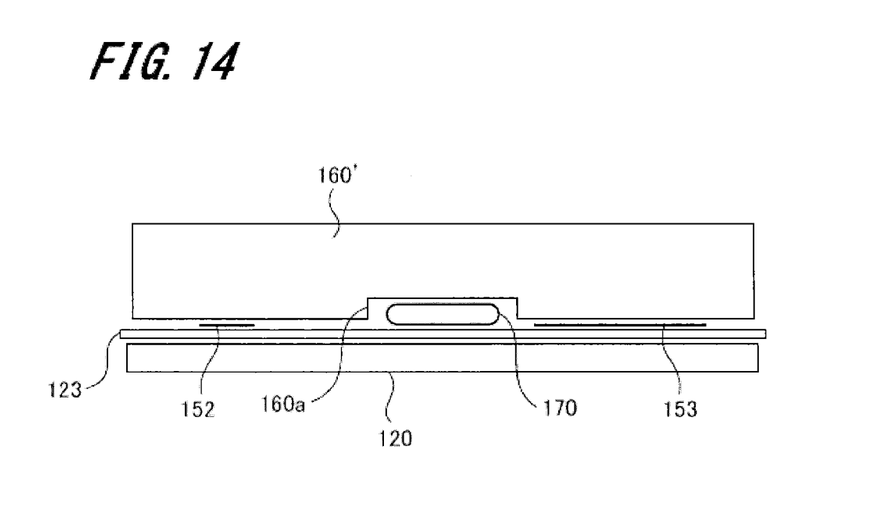
FIG. 14 illustrates a non-limiting example of a heat pipe in a battery recess.

In another aspect of the present disclosure, a heat pipe may be arranged on a mobile device battery. FIG. 14 illustrates a non-limiting example of arranging a heat pipe 170 in a recess 160a provided in a battery 160'. The recess 160a may correspond to a location in the mobile device 100 at which the heat pipe 170 is arranged. That is, the heat pipe 170 may be affixed to the battery within the recess 160a, or the recess 160a may provide a region to accommodate the heat pipe 170 when the heat pipe 170 is affixed to another element in the mobile device 100 (e.g., the battery cover 112). Circuit boards 152 and 153 may be interposed between the frame 123 and the battery 160'. In certain aspects of the present disclosure, the circuit boards 152 and 153 may be flexible circuit boards. Arranging a heat pipe within a recess of a mobile device battery, such as the example shown in FIG. 14, may further decrease the necessary thickness of the mobile device 100.

Figure 15:
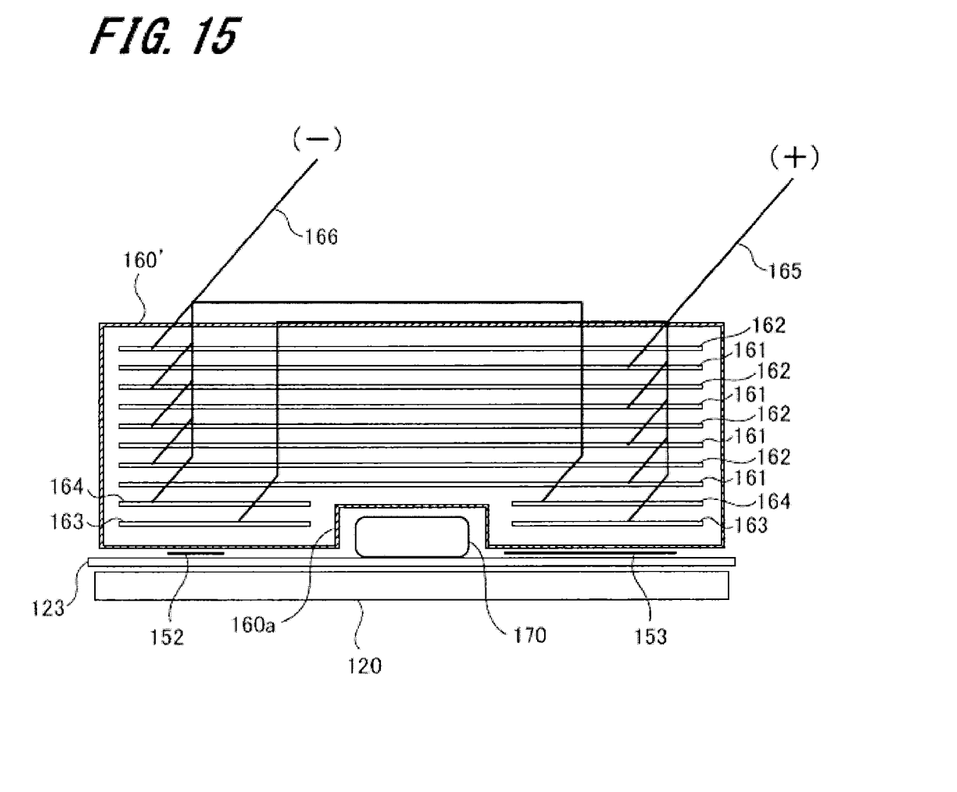
FIG. 15 illustrates a non-limiting example of an internal battery structure.

FIG. 15 illustrates an example of an internal structure of the battery 160' that includes the recess 160a. As shown in FIG. 15, the battery 160' may be a lithium-ion battery with a positive electrode 161 and a negative electrode 162 alternately disposed within the battery. A positive electrode 163 and a negative electrode 164 may be divided in two segments at a location corresponding to the recess 160a. A wiring 165 may be connected at each of the positive electrodes 161 and the positive electrode 163 to provide a positive connection terminal for the battery 160'. Similarly, a wiring 166 may be connected at each of the negative electrodes 162 and the negative electrode 164 to provide a negative connection terminal for the battery 160'. Providing the positive electrode 163 and the negative electrode 164 which are divided in two segments allows for the recess 160a to be provided without unnecessarily limiting the circuitry provided to power the mobile device in which the battery 160' is installed. Those of ordinary skill will appreciate that aspects of the present disclosure may be adapted such that a plurality of recesses are provided in a battery, in which case the number of electrode segments will be a function of the number of recesses. Further, aspects of the present disclosure may be adapted to other battery configurations and types.

Obviously, numerous modifications and variations of the present disclosure are possible in light of the above teachings. It is therefore to be understood that within the scope of the appended claims, the invention may be practiced otherwise than as specifically described herein. For example, advantageous results may be achieved if the steps of the disclosed techniques were performed in a different sequence, if components in the disclosed systems were combined in a different manner, or if the components were replaced or supplemented by other components.

The functions, processes and algorithms described herein may be performed in hardware or software executed by hardware, including computer processors and/or programmable circuits configured to execute program code and/or computer instructions to execute the functions, processes and algorithms described herein. Additionally, some implementations may be performed on modules or hardware not identical to those described. Accordingly, other implementations are within the scope that may be claimed. For example, aspects of the present disclosure may be adapted to provide heat transfer for displays other than LCD and LED type technology. Additionally, aspects of the present disclosure may be implemented in devices other than those described herein in the foregoing examples. For example, those of ordinary skill may apply features described herein to provide heat dissipation in tablet computers, laptop computers, e-readers, personal digital assistants (PDAs), smart phones, cellular telephones, portable displays, navigation units, music players, projectors, or the like.

Materials other than those described herein may be substituted to provide heat transfer mediums in accordance with the present disclosure. Further, the exemplary arrangements described herein may easily be adapted based on desired heat dissipation characteristics and/or internal arrangements of a mobile device. For example, structural aspects of the present disclosure may be applied to form heat dissipation surfaces in a shape corresponding to locations of elements within the device rather than predetermined arrangements, such as a linear arrangement. Moreover, the present disclosure is not limited to providing heat dissipation to the elements described herein. That is, those of ordinary skill will appreciate aspects of the present disclosure may easily be adapted such that heat may dissipated from elements other than a semiconductor chip, a battery, a display frame, etc.

The functions and features described herein may also be executed by various distributed components of a system. For example, one or more processors may execute these system functions, wherein the processors are distributed across multiple components communicating in a network. The distributed components may include one or more client and/or server machines, in addition to various human interface and/or communication devices (e.g., display monitors, smart phones, tablets, personal digital assistants (PDAs)). The network may be a private network, such as a LAN or WAN, or may be a public network, such as the Internet. Input to the system may be received via direct user input and/or received remotely either in real-time or as a batch process.

It must be noted that, as used in the specification and the appended claims, the singular forms "a," "an," and "the" include plural referents unless the context clearly dictates otherwise.

The above disclosure also encompasses the embodiments noted below.

(1) An apparatus comprising: a display including a frame disposed at a bottom surface of the display; circuitry including a semiconductor chip; and a first heat pipe affixed to the frame, the first heat pipe being comprised of a thermally conductive material, wherein a surface of the first heat pipe opposes the semiconductor chip at a predetermined distance from the semiconductor chip.

(2) The apparatus of (1), wherein the predetermined distance is based on a thermal radiation radius corresponding to the semiconductor chip.

(3) The apparatus of (1) or (2), wherein the first heat pipe includes at least one flat surface.

(4) The apparatus of any one of (1) to (3), wherein: a surface of the frame includes a recess portion, and the first heat pipe is arranged within the recess.

(5) The apparatus of any one of (1) to (4), wherein: a shield is formed over the semiconductor chip, and the first heat pipe contacts the shield.

(6) The apparatus of any one of (1) to (5), wherein the first heat pipe contacts the shield within a recess formed on a surface of the shield.

(7) The apparatus of any one of (1) to (6), wherein a conductive sheet is interposed between the first heat pipe and the shield.

(8) The apparatus of any one of (1) to (7), wherein a plurality of heat pipes are affixed to the frame.

(9) The apparatus of any one of (1) to (8), wherein the plurality of heat pipes are arranged at a predetermined spacing interval on a surface of the frame.

(10) The apparatus of any one of (1) to (9), wherein at least one heat pipe, of the plurality of heat pipes, is arranged on the surface of the frame in a perpendicular direction relative to the plurality of heat pipes arranged at the predetermined spacing interval.

(11) The apparatus of any one of (1) to (10), wherein the first heat pipe has a non-linear shape.

(12) The apparatus of any one of (1) to (11), wherein the first heat pipe bends from a centerline of a surface of the frame to an outer edge of the frame.

(13) The apparatus of any one of (1) to (12), wherein a liquid is enclosed within the first heat pipe, and the first heat pipe includes a high temperature region configured to collect steam generated in response to heating the liquid.

(14) The apparatus of any one of (1) to (13), wherein: the first heat pipe includes a low temperature region configured to collect condensed steam from the high temperature region, and the low temperature region is connected to the high temperature region such that the condensed steam flows from the low temperature region to the high temperature region.

(15) The apparatus of any one of (1) to (14), further comprising: a battery; and a second heat pipe affixed to a cover of the battery.

(16) The apparatus of any one of (1) to (15), wherein: the battery includes a recess having a size corresponding to a size of the second heat pipe, and the recess is arranged on the battery to correspond to a location at which the second heat pipe is affixed to the cover of the battery.

(17) The apparatus of any one of (1) to (16), wherein the recess is arranged on the battery such that a positive electrode and a negative electrode of the battery are split in two or more parts.

(18) The apparatus of any one of (1) to (17), wherein the second heat pipe contacts a shield formed over the semiconductor chip.

(19) The apparatus of any one of (1) to (18), further comprising one or more circuit boards interposed between the battery and the frame.

(20) A method of dissipating heat from a semiconductor chip in a mobile device, the method comprising: affixing a heat pipe to a frame disposed at a bottom surface of a display included on the mobile device; and dissipating heat generated by the semiconductor chip by arranging the heat pipe such that a surface of the heat pipe opposes the semiconductor chip at a predetermined distance from the semiconductor chip, wherein the heat pipe is comprised of a thermally conductive material.

(21) An apparatus comprising: a display including a frame disposed at a bottom surface of the display; a semiconductor chip; and a heat dissipation means for dissipating heat from the semiconductor chip, wherein the heat dissipation means is affixed to the frame, the heat dissipation means is comprised of a thermally conductive material, and a surface of the heat dissipation means opposes the semiconductor chip at a predetermined distance from the semiconductor chip.

The invention claimed is:
1. An apparatus comprising:
a display including a frame disposed at a bottom surface of the display;
a semiconductor chip;
a heat pipe affixed to the frame, the heat pipe being comprised of a thermally conductive material, wherein a surface of the heat pipe is adjacent to the semiconductor chip at a predetermined distance from the semiconductor chip; and
a battery, wherein
the battery includes a recess having three surfaces formed in an exterior portion of the battery and having a size corresponding to a size of the heat pipe and the recess is arranged on the battery to correspond to a location at which the heat pipe is affixed to the frame.
2. The apparatus of claim 1, wherein
the heat pipe includes at least one flat surface.
3. The apparatus of claim 1, wherein
the heat pipe is arranged within the recess.
4. The apparatus of claim 1, wherein
a liquid is enclosed within the heat pipe, and
the heat pipe includes a high temperature region configured to collect steam generated in response to heating the liquid.
5. The apparatus of claim 4, wherein:
the heat pipe includes a low temperature region configured to collect condensed steam from the high temperature region, and
the low temperature region is connected to the high temperature region such that the condensed steam flows from the low temperature region to the high temperature region.
6. The apparatus of claim 1, wherein
the recess is arranged on the battery such that a positive electrode and a negative electrode of the battery are split in two or more parts.
7. The apparatus of claim 6, wherein
the positive electrode is provided on a first side of the recess and the negative electrode is provided on a second side of the recess.
8. The apparatus of claim 1, wherein
the semiconductor chip is disposed on the frame.
9. The apparatus of claim 8, wherein
the semiconductor chip is disposed on the frame on a first side of the recess.
10. The apparatus of claim 9, further comprising:
another semiconductor chip disposed on the frame on a second side of the recess that it opposite to the first side of the recess.
11. An apparatus comprising:
a display including a frame disposed at a bottom surface of the display;
a semiconductor chip;
a heat dissipation means for dissipating heat from the semiconductor chip, wherein the heat dissipation means is affixed to the frame, the heat dissipation means is comprised of a thermally conductive material, and a surface of the heat dissipation means opposes the semiconductor chip at a predetermined distance from the semiconductor chip; and
a battery, wherein
the battery includes a recess having three surfaces formed in an exterior portion of the battery and having a size corresponding to a size of the heat dissipation means and the recess is arranged on the battery to correspond to a location at which the heat dissipation means is affixed to the frame.

\* \* \* \* \*